United States Patent
Lu et al.

(10) Patent No.: US 10,529,680 B2
(45) Date of Patent: Jan. 7, 2020

(54) ENCAPSULATED ELECTRONIC DEVICE MOUNTED ON A REDISTRIBUTION LAYER

(71) Applicant: CYNTEC CO., LTD., Hsinchu (TW)

(72) Inventors: Bau-Ru Lu, Changhua County (TW); Ming-Chia Wu, Hsinchu (TW)

(73) Assignee: CYNTEC CO., LTD, Hsinchu (TW)

( * ) Notice: Subject to any disclaimer, the term of this patent is extended or adjusted under 35 U.S.C. 154(b) by 0 days.

(21) Appl. No.: 15/485,235

(22) Filed: Apr. 12, 2017

(65) Prior Publication Data

US 2017/0221849 A1    Aug. 3, 2017

Related U.S. Application Data

(63) Continuation of application No. 13/950,335, filed on Jul. 25, 2013, now Pat. No. 9,655,253.

(51) Int. Cl.
| | |
|---|---|
| H01L 23/34 | (2006.01) |
| H01L 23/28 | (2006.01) |
| H01L 21/00 | (2006.01) |
| H01L 21/4763 | (2006.01) |
| H01L 23/00 | (2006.01) |
| H01L 23/538 | (2006.01) |
| H01L 21/683 | (2006.01) |
| H01L 21/56 | (2006.01) |
| H05K 3/28 | (2006.01) |

(Continued)

(52) U.S. Cl.
CPC ............ *H01L 24/24* (2013.01); *H01L 21/561* (2013.01); *H01L 21/568* (2013.01); *H01L 21/6835* (2013.01); *H01L 23/3114* (2013.01); *H01L 23/5389* (2013.01); *H01L 23/552* (2013.01); *H01L 24/19* (2013.01); *H01L 24/96* (2013.01); *H01L 24/97* (2013.01); *H05K 3/284* (2013.01); *H01L 21/56* (2013.01); *H01L 2224/04105* (2013.01); *H01L 2224/19* (2013.01); *H01L 2224/24137* (2013.01); *H01L 2924/1206* (2013.01); *H01L 2924/13055* (2013.01); *H01L 2924/13091* (2013.01); *H01L 2924/19041* (2013.01); *H01L 2924/19043* (2013.01); *H01L 2924/19105* (2013.01); *H01L 2924/3025* (2013.01); *H05K 1/0218* (2013.01)

(58) Field of Classification Search
CPC ..... H01L 21/568; H01L 24/24; H01L 21/561; H01L 23/3114; H01L 23/552; H01L 24/19; H01L 24/96
See application file for complete search history.

(56) References Cited

U.S. PATENT DOCUMENTS

| | | | | |
|---|---|---|---|---|
| 7,119,419 B2 * | 10/2006 | Kato | ...................... | B82Y 10/00 257/295 |
| 8,039,304 B2 * | 10/2011 | Pagaila | ................. | H01L 21/561 257/E21.705 |

(Continued)

*Primary Examiner* — Alonzo Chambliss
(74) *Attorney, Agent, or Firm* — Ming-Lee Teng; Litron Patent & Trademark Office

(57) ABSTRACT

A substrateless device comprises a plurality of first conductive elements and an encapsulant. The encapsulant encapsulates the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate.

18 Claims, 4 Drawing Sheets

(51) Int. Cl.
*H01L 23/31* (2006.01)
*H01L 23/552* (2006.01)
*H05K 1/02* (2006.01)

(56) References Cited

U.S. PATENT DOCUMENTS

| | | | |
|---|---|---|---|
| 8,736,032 B2* | 5/2014 | Kim | H01L 24/97 |
| | | | 257/659 |
| 9,655,253 B2* | 5/2017 | Lu | H05K 3/284 |
| 2007/0222062 A1* | 9/2007 | Sunohara | H01L 21/4857 |
| | | | 257/700 |
| 2009/0170241 A1* | 7/2009 | Shim | H01L 21/568 |
| | | | 438/107 |
| 2013/0093069 A1* | 4/2013 | Lu | H01L 23/13 |
| | | | 257/666 |
| 2015/0262977 A1* | 9/2015 | Pagaila | H01L 21/561 |
| | | | 257/773 |

* cited by examiner

31 — provide a plurality of first conductive elements.

32 — form an encapsulant to encapsulate the plurality of first conductive elements, wherein the locations of the plurality of first conductive elements are fixed by the encapsulant; and a plurality of terminals of the plurality of first conductive elements are exposed to the encapsulant, wherein the plurality of first conductive elements are not supported by a substrate.

33 — form a circuit pattern layer on the bottom surface of the encapsulant to electrically connect the plurality of terminals of the plurality of first conductive elements.

FIG. 2

ENCAPSULATED ELECTRONIC DEVICE MOUNTED ON A REDISTRIBUTION LAYER

CROSS-REFERENCES TO RELATED APPLICATIONS

This application is a continuation of U.S. patent application Ser. No. 13/950,335, filed on Jul. 25, 2013, which is hereby incorporated by reference herein and made a part of specification.

BACKGROUND OF THE INVENTION

I. Field of the Invention

The present invention relates to a package structure and, in particular, to a substrateless device.

II. Description of the Prior Art

Lead frame is a material for IC package and can be in variety of forms, such as QFP, TSOP, SOT or SOJ. The molded semiconductor devices are constructed by assembling and interconnecting a semiconductor device to a lead frame. The structure is often molded with plastic material. A lead frame is made by a metal ribbon with a paddle (also known as a die paddle, die-attach tab, or island) for attaching a semiconductor device thereto and a plurality of leads arranged in a manner such that the leads do not overlap the paddle on which the semiconductor device is to be mounted.

Conventionally, lead frame is used for die bond of an IC chip. The process flow includes many stages which include wire bond, molding of IC chip, and the tests after trimming or forming. Various products can be made by integrating or packaging the lead frame with other devices such as inductors or capacitors. It's one of the main package processes in the industry due to its easiness, maturity and better reliability. However, such kind of conventional process has many disadvantages including: a. higher cost and more development works of molding devices; b. poor capability in area design which is only in the form of plane so that product size doesn't shrink; c. lacking of modular capability as it is only good for packaging a single device; d. poor performance in heat dissipation and poor yield; and e. hard to shrink the module size because of the lead frame of a bulk volume. Accordingly, the present invention proposes a substrateless device and its manufacturing method to overcome the above-mentioned disadvantages.

SUMMARY OF THE INVENTION

One objective of the present invention is to provide a substrateless device which is not supported by a substrate. It doesn't need a lead frame or a PCB to support the conductive elements so that the material cost can be reduced and device size can be shrunk. Moreover, the pin location and the pin number of the device can be modified according to design demand. The substrateless device comprises: a plurality of first conductive elements; and an encapsulant encapsulating the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate.

Preferably, the terminals of the first conductive elements are exposed outside the bottom surface of the encapsulant. The substrateless device can further comprise a circuit pattern layer disposed on the bottom surface of the encapsulant.

Another objective of the present invention is to provide a method of forming a substrateless device. The method comprises the steps of: providing a plurality of first conductive elements; and forming an encapsulant to encapsulate the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate.

In the preferred embodiment, a supporting body is provided; a plurality of first conductive elements are disposed on the supporting body; an encapsulant is formed to encapsulate the plurality of first conductive elements; and the supporting body is removed to expose a plurality of terminals of the plurality of first conductive elements. The function of the supporting body is to position a conductive element thereon. The supporting body can be a carrier (e.g., glass substrate) or an adhesive tape.

The detailed technology and above preferred embodiments implemented for the present invention are described in the following paragraphs accompanying the appended drawings for people skilled in the art to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein:

FIG. 2 is the process flow of manufacturing a substrateless device in FIG. 1A and FIG. 1B.

DETAILED DESCRIPTION OF THE INVENTION

The detailed explanation of the present invention is described as following. The described preferred embodiments are presented for purposes of illustrations and description, and they are not intended to limit the scope of the present invention.

The invention discloses a substrateless device which is not supported by a substrate. The substrateless device comprises: a plurality of first conductive elements; and an encapsulant encapsulating the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate. The advantages of the substrateless device include the followings: 1. it doesn't need a lead frame or a PCB to support the conductive elements so that the material cost can be reduced and device size can be shrunk; 2. the pin location and the pin number of the device can be modified according to design demand; 3. the device has the shortest circuit path such that circuit impedance can be reduced and electrical efficiency can be raised; 4. it is suitable for circuit modularization. 5. it is suitable for surface mount technology (SMT); 6. the encapsulant can protect the conductive elements therein; 7. electroplating via-process can be used in forming a circuit pattern layer to reduce impedance and dissipate heat; 8. it has smaller module area due to device integration and space stack.

Figure 1A:
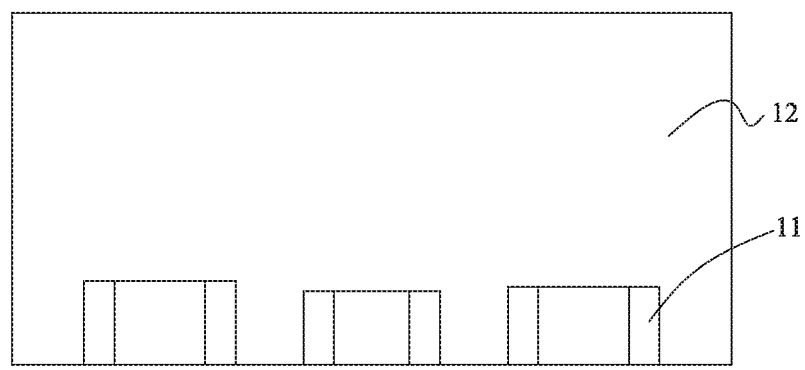
FIG. 1A illustrates a schematic cross-sectional view of a substrateless device in the present invention.
Figure 1B:
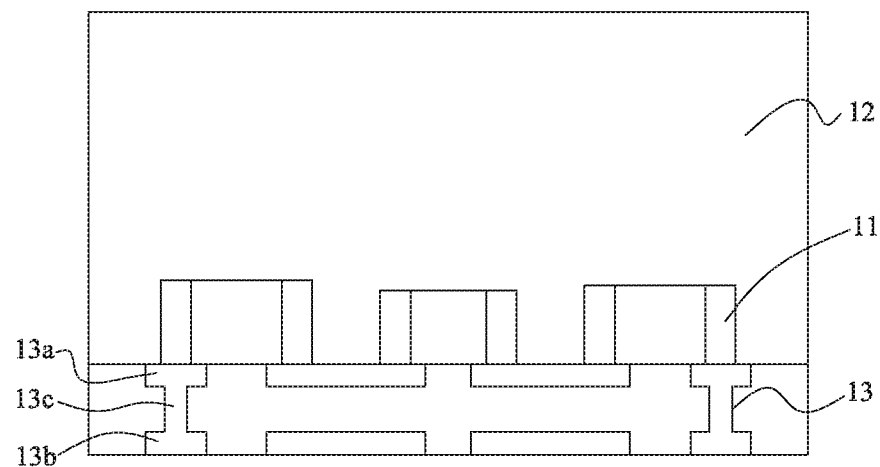
FIG. 1B illustrates a schematic cross-sectional view of a substrateless device having a circuit pattern layer on the bottom surface of the encapsulant.

FIG. 1A illustrates a schematic cross-sectional view of a substrateless device 10 in the present invention. FIG. 1B illustrates a schematic cross-sectional view of a substrateless device 10 having a circuit pattern layer 13 on the bottom surface of the encapsulant 12. The substrateless device 10 includes a plurality of first conductive elements 11 and an encapsulant 12. Preferably, the substrateless device 10 has a circuit pattern layer 13 on the bottom surface of the encapsulant 12.

Each of the first conductive elements 11 can comprise at least one of IC chip, MOSFET, IGBT, diode, resistor, choke or capacitor. An encapsulant 12 is formed to encapsulate the first conductive elements 11. The encapsulant 12 can be made of any suitable material, such as epoxy, oxide or a polymer-based material. A plurality of terminals of the first conductive elements 11 are exposed outside the encapsulant 12 to function as electrodes. Preferably, the terminals of the first conductive elements 11 are exposed outside the bottom surface of the encapsulant 12. In other words, the electrodes of the first conductive elements 11 are disposed on the surface, preferably the bottom surface, of the encapsulant 12 for external electrical connection such that the distance between the first conductive elements 11 can be reduced.

In the preferred embodiment, refer to FIG. 1B, a circuit pattern layer 13 is formed on the bottom surface of the encapsulant 12 to electrically connect the terminals of the first conductive elements 11 to make electrical connection between the first conductive elements 11 and to further extend the electrodes of the first conductive elements 11 for external connection. Preferably, the circuit pattern layer 13 is in direct contact with the terminals of the first conductive elements 11. The circuit pattern layer 13 can comprise a plurality of circuit layers. For example, the circuit pattern layer 13 comprises a top RDL (redistribution layer) 13a, a bottom RDL 13b and a via layer 13c between the top RDL 13a and the bottom RDL 13b. The top RDL 13a makes electrical connection between the first conductive elements 11, and bottom RDL 13b further extends the electrodes of the first conductive elements 11 for external connection.

Figure 1C:
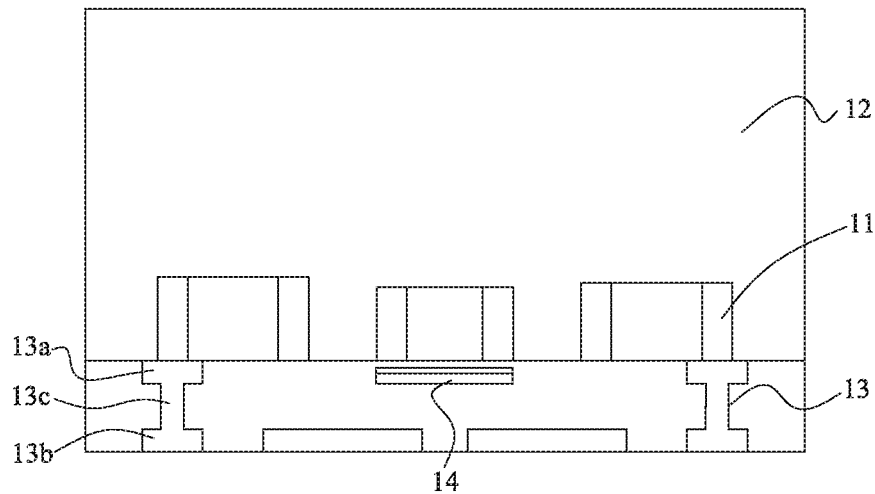
FIG. 1C illustrates a schematic cross-sectional view of a substrateless device, wherein a second conductive element is disposed in the circuit pattern layer.

FIG. 1C illustrates a schematic cross-sectional view of a substrateless device 10, wherein a second conductive element 14 is disposed in the circuit pattern layer 13. To shrink module size, the second conductive element 14 can be disposed in the circuit pattern layer 13. The second conductive element 14 has at least one terminal (not shown), and at least one terminal of the second conductive element 14 is electrically connected the circuit pattern layer 13. There are many ways to dispose the second conductive element(s) 14: the second conductive element 14 can be disposed in one of the circuit layers; one of the second conductive elements 14 can be disposed in one of the circuit layers, and another of the second conductive elements 14 can be disposed in another of the circuit layers; or all of the second conductive elements 14 can be disposed in one of the circuit layers.

Figure 1D:
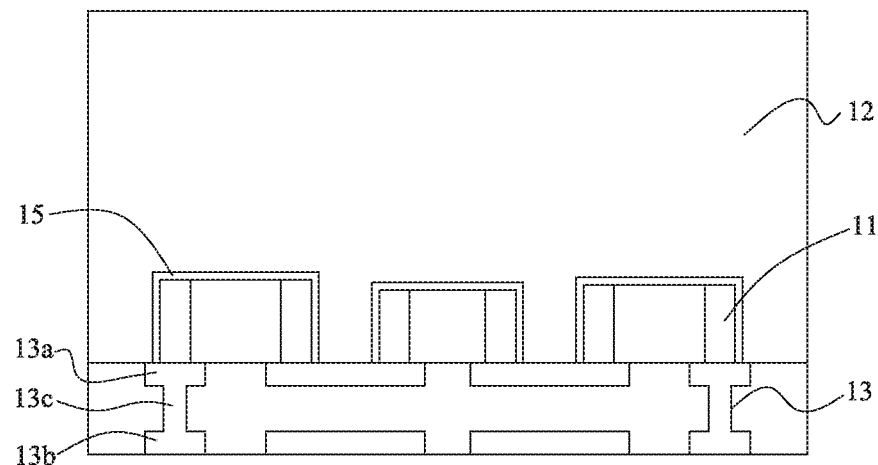
FIG. 1D to FIG. 1F illustrate a schematic cross-sectional view of a substrateless device having a shielding material therein.
Figure 1E:
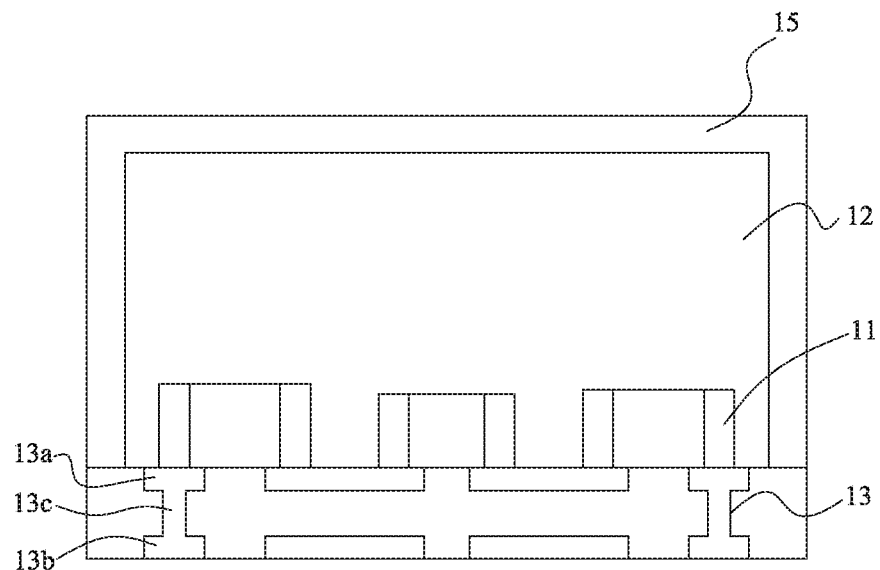
Figure 1F:
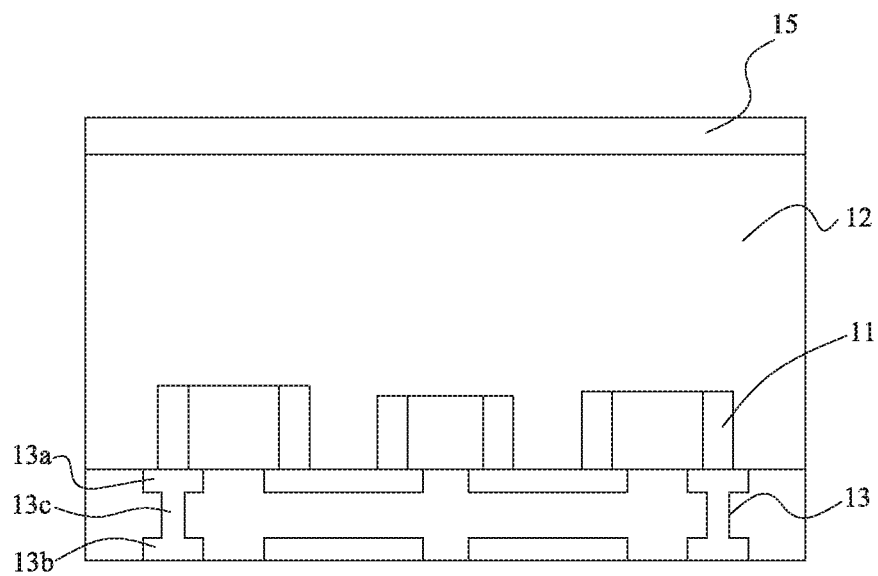

FIG. 1D to FIG. 1F illustrate a schematic cross-sectional view of a substrateless device 10 having a shielding material 15 therein. According to the electrical requirement, the substrateless device 10 can further comprise a shielding material 15 to reduce the interference between conductive elements or between modules. For example, at least one portion of the surface or the periphery of the first conductive elements 11 is covered with a shielding material 15 disposed in the encapsulant 12 (see FIG. 1D); or at least one portion of the surface of the encapsulant 12 is covered with a shielding material 15 (see FIG. 1E and FIG. 1F).

FIG. 2 is the process flow of manufacturing a substrateless device 10 in FIG. 1A and FIG. 1B.

In step 31, provide a plurality of first conductive elements 11. Each of the plurality of first conductive elements 11 can comprise at least one of IC chip, MOSFET, IGBT, diode, resistor, choke or capacitor.

In step 32, form an encapsulant 12 to encapsulate the plurality of first conductive elements 11, wherein the locations of the plurality of first conductive elements 11 are fixed by the encapsulant 12; and a plurality of terminals of the plurality of first conductive elements 11 are exposed outside the encapsulant 12, wherein the plurality of first conductive elements 11 are not supported by a substrate. Preferably, the terminals of the first conductive elements 11 are exposed outside the bottom surface of the encapsulant 12. Then, a post molding cure is performed. The encapsulant 12 can be made of any suitable material, such as epoxy, oxide or a polymer-based material. In one embodiment, at least one portion of the surface of a plurality of first conductive elements 11 is covered with a shielding material 15 before step 32.

In the preferred embodiment, a supporting body (not shown) is provided; a plurality of first conductive elements 11 are disposed on the supporting body; an encapsulant 12 is formed to encapsulate the plurality of first conductive elements 11; and the supporting body is removed to expose a plurality of terminals of the plurality of first conductive elements 11. In other words, step 31 further comprises providing a supporting body and disposing the plurality of first conductive elements 11 on the supporting body; wherein the step 32 further comprises removing the supporting body to expose the plurality of terminals of the plurality of first conductive elements 11 after forming the encapsulant 12 to encapsulate the plurality of first conductive elements 11. Alternatively, step 31 further comprises forming an adhesion layer (not shown) between the plurality of first conductive elements 11 and the supporting body; and step 32 further comprises removing the adhesion layer to expose the plurality of terminals of the plurality of first conductive elements 11 after removing the supporting body. The function of the supporting body is to position a conductive element thereon. The supporting body can be a carrier (e.g., glass substrate) or an adhesive tape.

In step 33, form a circuit pattern layer 13 on the bottom surface of the encapsulant 12 to electrically connect the plurality of terminals of the plurality of first conductive elements 11. Specifically speaking, the circuit pattern layer 13 is formed on the reversed bottom surface of the encapsulant 12. The circuit pattern layer 13 can be formed by performing a lithography process, which is widely adapted for multiple pins meeting customers' demand. Compared to a lead frame serving as pins (the space of the lead frame is too large to define the process accuracy), the lithography process can precisely define pins of smaller size. The circuit pattern layer 13 can comprise a plurality of circuit layers. For example, the circuit pattern layer 13 comprises a top RDL (redistribution layer) 13a, a bottom RDL 13b and a via layer 13c between the top RDL 13a and the bottom RDL 13b. The top RDL 13a makes electrical connection between the first conductive elements 11, and bottom RDL 13*b* further extends the electrodes of the first conductive elements 11 for external connection. To shrink module size, the second conductive element 14 can be disposed in the circuit pattern layer 13. In one embodiment, a shielding material 15 is disposed to cover at least one portion of the surface of the encapsulant 12.

Take the circuit pattern layer 13 comprising a top RDL (redistribution layer) 13*a*, a bottom RDL 13*b* and a via layer 13*c* between the top RDL 13*a* and the bottom RDL 13*b* for example and detailed process is listed as below. Any circuit pattern layer can be derived from the following process steps, and it doesn't be further described in detail herein.

(a) Perform a first lithography process to form a top RDL 13*a*. This step can comprise sputter, dry film lamination, exposure, development, plating, de-film and etching.

(b) Perform a second lithography process to form a via layer 13*b*. This step can comprise printing, exposure, development and cure.

(c) Perform a third lithography process to form a bottom RDL 13*c*. This step can comprise sputter, dry film lamination, exposure, development, plating, de-film and etching.

(d) Perform a fourth lithography process to perform Ni/Au electroplating. This step can comprise printing, exposure, development, cure, Ni plating and Au plating.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A sub strateless device, comprising:
    a plurality of first discrete electronic components;
    an encapsulant encapsulating the plurality of first discrete electronic components, wherein a plurality of terminals of the plurality of first discrete electronic components are exposed from a bottom surface of the encapsulant;
    at least one redistribution layer, disposed over the bottom surface of the encapsulant, wherein the plurality of terminals are electrically connected to said at least one redistribution layer, wherein at least two discrete electronic components of the plurality of first discrete electronic components are electrically connected by said at least one redistribution layer, and the plurality of first discrete electronic components and said at least one redistribution layer are not supported by a substrate; and
    a second electronic component, disposed below the bottom surface of the encapsulant and above a bottom surface of the at least one redistribution layer, wherein the second electronic component is disposed in and electrically connected to the at least one redistribution layer; and a first shielding layer, disposed in the encapsulant and covering at least one portion of the plurality of first discrete electronic components.

2. The substrateless device according to claim 1, wherein the bottom surface of the at least one redistribution layer comprises a plurality of surface-mount pads that are used as electrodes of the substrateless device for connecting with an external circuit outside the substrateless device.

3. The substrateless device according to claim 1, wherein the plurality of first discrete electronic components comprise a discrete passive electronic component.

4. The substrateless device according to claim 1, wherein the at least one redistribution layer comprises a top redistribution layer and a bottom redistribution layer.

5. The substrateless device according to claim 1, further comprising a second shielding layer disposed over the encapsulant and encapsulating at least one portion of the outer surface of the encapsulant.

6. The substrateless device according to claim 1, further comprising a second shielding layer disposed over the encapsulant and encapsulating the top surface and two opposite lateral surfaces of the encapsulant.

7. The substrateless device according to claim 1, further comprising a second shielding layer disposed over the encapsulant and encapsulating the top surface and four lateral surfaces of the encapsulant.

8. The substrateless device according to claim 1, wherein the plurality of first discrete electronic components comprise an IGBT and an inductor.

9. The substrateless device according to claim 1, wherein the plurality of first discrete electronic components comprise a MOSFET and an inductor.

10. The substrateless device according to claim 1, wherein the plurality of first discrete electronic components comprise an IGBT and an inductor.

11. A sub strateless device, comprising:
    a plurality of first discrete electronic components;
    an encapsulant encapsulating the plurality of first discrete electronic components, wherein a plurality of terminals of the plurality of first discrete electronic components are exposed from a bottom surface of the encapsulant;
    at least one redistribution layer, disposed over the bottom surface of the encapsulant, wherein the plurality of terminals are electrically connected to said at least one redistribution layer, wherein at least two discrete electronic components of the plurality of first discrete electronic components are electrically connected by said at least one redistribution layer, and the plurality of first discrete electronic components and said at least one redistribution layer are not supported by a substrate;
    a second electronic component, disposed below the bottom surface of the encapsulant and above a bottom surface of the at least one redistribution layer, wherein the second electronic component is disposed in and electrically connected to the at least one redistribution layer; and
    a first shielding layer, disposed on the encapsulant to encapsulate at least one portion of the outer surface of the encapsulant; and a first shielding layer, disposed in the encapsulant and covering at least one portion of the plurality of first discrete electronic components.

12. The substrateless device according to claim 11, wherein the plurality of first discrete electronic components comprise a discrete passive electrical component.

13. The substrateless device according to claim 11, wherein the at least one redistribution layer comprises a top redistribution layer and a bottom redistribution layer.

14. The substrateless device according to claim 11, wherein the bottom surface of the at least one redistribution layer comprises a plurality of surface-mount pads that are used as electrodes of the substrateless device for connecting with an external circuit outside the substrateless device.

15. The substrateless device according to claim 11, wherein the plurality of first discrete electronic components comprise a MOSFET and an inductor.

16. The substrateless device according to claim 11, wherein the first shielding layer encapsulates the entire top surface of the encapsulant.

17. The substrateless device according to claim 11, wherein the first shielding layer encapsulates the entire top surface and two opposite lateral surfaces of the encapsulant.

18. The substrateless device according to claim 11, wherein the first shielding layer encapsulates the entire top surface and four lateral surfaces of the encapsulant.

* * * * *